United States Patent
Yang et al.

(10) Patent No.: US 11,687,766 B2
(45) Date of Patent: Jun. 27, 2023

(54) ARTIFICIAL NEURAL NETWORKS WITH PRECISION WEIGHT FOR ARTIFICIAL INTELLIGENCE

(71) Applicant: QUALCOMM Incorporated, San Diego, CA (US)

(72) Inventors: Haining Yang, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 905 days.

(21) Appl. No.: 16/012,451

(22) Filed: Jun. 19, 2018

(65) Prior Publication Data

US 2019/0385049 A1 Dec. 19, 2019

(51) Int. Cl.
*G06N 3/065* (2023.01)
*G06N 3/084* (2023.01)
*G11C 11/54* (2006.01)

(52) U.S. Cl.
CPC ............ *G06N 3/065* (2023.01); *G06N 3/084* (2013.01); *G11C 11/54* (2013.01)

(58) Field of Classification Search
CPC ...... G06N 3/0635; G06N 3/084; G06N 3/063; G06N 3/08; G11C 11/54
See application file for complete search history.

(56) References Cited

U.S. PATENT DOCUMENTS

| | | | | |
|---|---|---|---|---|
| 4,807,168 A | * | 2/1989 | Moopenn | G06N 3/063 365/49.1 |
| 5,021,988 A | * | 6/1991 | Mashiko | G06N 3/0635 706/30 |
| 5,103,496 A | * | 4/1992 | Andes | G06N 3/063 706/39 |
| 5,457,771 A | * | 10/1995 | Imondi | G06N 3/0635 706/33 |
| 5,468,680 A | * | 11/1995 | Cohen | H01L 23/5256 438/467 |
| 7,183,141 B1 | * | 2/2007 | Bulovic | B82Y 10/00 438/467 |
| 10,217,512 B1 | | 2/2019 | Leobandung | |

(Continued)

OTHER PUBLICATIONS

Jutten et al. "Simulation machine and integrated implementation of neural networks." European Association for Signal Processing Workshop. Springer, Berlin, Heidelberg, 1990: 243-266 (Year: 1990).*

(Continued)

*Primary Examiner* — Alan Chen
*Assistant Examiner* — Randall K. Baldwin
(74) *Attorney, Agent, or Firm* — Holland & Hart LLP

(57) ABSTRACT

Methods, systems, and devices for an artificial neural network are described. In one example, an artificial neuron in an artificial neural network may include a resistor coupled with an input line and configured to indicate a synaptic weight and a fuse coupled with the resistor. The artificial neuron may also include a selection component coupled with the fuse and configured to activate the fuse for programming the resistor, and a second selection component coupled with the resistor and an output line, the second selection component configured to select the resistor for a read operation.

13 Claims, 7 Drawing Sheets

(56) References Cited

U.S. PATENT DOCUMENTS

| | | | | |
|---|---|---|---|---|
| 2004/0150010 | A1* | 8/2004 | Snider | G11C 13/0014 257/209 |
| 2005/0231297 | A1* | 10/2005 | Aparin | H03L 1/023 331/177 V |
| 2011/0080765 | A1* | 4/2011 | Groepl | G11C 17/18 365/96 |
| 2011/0119214 | A1* | 5/2011 | Breitwisch | G06N 3/0635 706/33 |
| 2011/0119215 | A1* | 5/2011 | Elmegreen | G06N 3/0635 706/37 |
| 2015/0106314 | A1* | 4/2015 | Birdwell | G06N 3/08 706/25 |
| 2015/0269978 | A1* | 9/2015 | Jung | G11C 17/18 365/96 |
| 2016/0224887 | A1* | 8/2016 | Friedman | G11C 13/0004 |
| 2019/0205729 | A1* | 7/2019 | Tran | G06F 17/16 |
| 2019/0378002 | A1* | 12/2019 | Yajima | G06N 3/08 |

OTHER PUBLICATIONS

Adhikari, Shyam Prasad, et al. "Memristor bridge synapse-based neural network and its learning." IEEE Transactions on Neural Networks and Learning Systems 23.9 (2012): 1426-1435. (Year: 2012).*

Kim, Hyungjin, et al. "Silicon synaptic transistor for hardware-based spiking neural network and neuromorphic system." Nanotechnology 28.40 (2017): 405202: 1-10 (Year: 2017).*

Wang et al. "Unconventional computing with diffusive memristors." 2018 IEEE International Symposium on Circuits and Systems (ISCAS). IEEE, May 2018: 1-5 (Year: 2018).*

Duan, Shukai, et al. "Memristor-based cellular nonlinear/neural network: design, analysis, and applications." IEEE transactions on neural networks and learning systems 26.6 (2014): 1202-1213. (Year: 2014).*

Hu, Xiaofang, et al. "A memristive multilayer cellular neural network with applications to image processing." IEEE transactions on neural networks and learning systems 28.8 (2016): 1889-1901. (Year: 2016).*

Kim, Hyongsuk, et al. "Neural synaptic weighting with a pulse-based memristor circuit." IEEE Transactions on Circuits and Systems I: Regular Papers 59.1 (2011): 148-158. (Year: 2011).*

Kim, Hyongsuk, et al. "Memristor bridge synapses." Proceedings of the IEEE 100.6 (2011): 2061-2070. (Year: 2011).*

Starzyk, Janusz A. "Memristor crossbar architecture for synchronous neural networks." IEEE Transactions on Circuits and Systems I: Regular Papers 61.8 (2014): 2390-2401. (Year: 2014).*

Ngwar, Melin, and Jim Wight. "A fully integrated analog neuron for dynamic multi-layer perceptron networks." 2015 International joint conference on neural networks (IJCNN). IEEE, 2015. (Year: 2015).*

Zhang, Yang, Xiaoping Wang, and Eby G. Friedman. "Memristor-based circuit design for multilayer neural networks." IEEE Transactions on Circuits and Systems I: Regular Papers 65.2 (2017): 677-686. (Year: 2017).*

Rossetto, Olivier, et al. "Analog VLSI synaptic matrices as building blocks for neural networks." IEEE Micro 9.6 (1989): 56-63. (Year : 1989).*

Hu, Chenming. "Interconnect devices for field programmable gate array." 1992 International Technical Digest on Electron Devices Meeting. IEEE, 1992: 24.1.1-24.1.4 (Year: 1992).*

Aono, Masakazu, and Tsuyoshi Hasegawa. "The atomic switch." Proceedings of the IEEE 98.12 (2010): 2228-2236. (Year: 2010).*

* cited by examiner

ARTIFICIAL NEURAL NETWORKS WITH PRECISION WEIGHT FOR ARTIFICIAL INTELLIGENCE

BACKGROUND

The following relates generally to an artificial neural network, and more specifically to artificial neural networks with precision weight for artificial intelligence.

Memory devices are widely used to store information in various electronic devices such as computers, wireless communication devices, cameras, digital displays, and the like. Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

The use of a non-volatile memory (NVM) device, such as a PCM device, has been applied for artificial neural networks. Although, PCM devices produce improved results compared to some techniques that support neuromorphic and non-von Neuman computation, variable characteristics (e.g., variation in PCM size) of these devices still pose performance challenges to reach effective results for training artificial neural networks. Besides variation in PCM size, chip-to-chip variation in some manufacturing techniques for front-end-of-the-line (FEOL) device or back-end-of-the-line (BEOL) device provide a limited number of chips for artificial neural network applications. Another challenge may be the volume logic semiconductor manufacturing flow, which may limit the adoption of existing applications for artificial neural networks. Improving techniques, methods, and related devices and integrated circuits for realizing artificial neural networks may be desirable.

SUMMARY

The described techniques relate to improved methods, systems, devices, and apparatuses that support an improved artificial neural network with precision weight for artificial intelligence. Specifically, the described techniques herein may support a precise weight artificial neural network. In some examples, each artificial neuron of the artificial neural network may include a combination of a precision metal resistor, an eFuse, and a quantity of transistors, among other components. The weight of each artificial neuron may be determined by the combination of precision metal resistors, which can be programmed based on one or more eFuses. The weight is precise and may have a large separation between states, which may make it less susceptible to manufacturing variations and voltage drops across the precision metal resistor. The improved artificial neural network may be non-volatile for low-power applications. In some implementations, the artificial neural network may have a one-time programmable feature, which may be suitable for inference applications on electronic devices (e.g., smartphones).

A device for an artificial neural network is described. The device may include an input line, an output line, and an artificial neuron including: a resistor coupled with the input line and configured to indicate a synaptic weight, a fuse coupled with the resistor, a first selection component coupled with the fuse, the first selection component configured to activate the fuse for programming the resistor, and a second selection component coupled with the resistor and the output line, the second selection component configured to select the resistor for a read operation.

The device described herein, in some examples, may further include a transistor coupled with the resistor and the fuse, and a voltage source configured to activate the fuse and coupled with the transistor. In some examples, the voltage source may be further configured to apply a voltage signal to the first selection component to activate the fuse for programming the resistor. In some examples of the device, the first selection component coupled with the fuse may be virtually grounded.

In some examples, the voltage source may be further configured to apply a voltage signal to the second selection component to couple the resistor and the input line with the output line. The device described herein, in some examples, may further include a controller coupled with the artificial neuron, where the controller is configured to read a value of the resistor configured to indicate the synaptic weight of the artificial neuron based at least in part on coupling the resistor and the input line with the output line.

In some examples of the device, the voltage source may be coupled with a third selection component that is coupled with the fuse and the resistor, where selecting the resistor for the read operation is further based at least in part on coupling the third selection component with the fuse and the resistor.

In some examples of the device, the artificial neuron may further include a second resistor coupled with the input line and configured to indicate the synaptic weight, a second fuse coupled with the second resistor, a fourth selection component coupled with the second fuse, the fourth selection component configured to activate the second fuse for programming the second resistor, and a fifth selection component coupled with the second resistor and the output line, the fifth selection component configured to select the second resistor for the read operation. In some examples of the device, the voltage source may be further configured to apply a voltage signal to the fourth selection component to decouple the second fuse from the second resistor based at least in part on a programming operation.

The device described herein, in some examples, may further include a controller coupled with the artificial neuron, wherein the controller is configured to disconnect the second resistor from the artificial neuron based at least in part on decoupling the second fuse from the second resistor. In some examples of the device, the synaptic weight of the artificial neuron is based at least in part on a resistance of the resistor and a resistance of the second resistor. In some examples of the device, the resistor comprises a precision metal resistor.

An apparatus for an artificial neural network is described. The apparatus may include a processor, memory in electronic communication with the processor, and instructions stored in the memory and executable by the processor to cause the apparatus to: activate at least one transistor of a plurality of transistors to select an artificial neuron from an artificial neural network, each transistor coupled with a corresponding resistor and a corresponding fuse of the artificial neuron, based on an input signal, activate at least a second transistor coupled with the corresponding resistor and the corresponding fuse of the artificial neuron to activate the corresponding fuse for programming the corresponding resistor, based on a second input signal, and apply a voltage signal to the corresponding fuse based on activating the at least one transistor of the plurality and the second transistor coupled with the corresponding fuse.

Some examples of the apparatus described above may further include features, means, or instructions for disconnecting the corresponding resistor from the artificial neuron based at least in part on applying the voltage signal to the corresponding fuse. In some examples of the apparatus described above, programming the corresponding resistor comprises disconnecting the corresponding resistor from the artificial neuron.

Some examples of the apparatus described above may further include features, means, or instructions for coupling the resistor and an input line with an output line based at least in part on the input signal, and reading a value of the resistor configured to indicate a synaptic weight of the artificial neuron based at least in part on coupling the resistor and the input line with the output line. In some examples of the apparatus described above, the artificial neuron comprises the resistor configured to indicate a synaptic weight, a fuse coupled with the resistor, the at least one transistor of a plurality of transistors, and the second transistor.

An artificial neuron of an artificial neural network is described. The artificial neuron may include a resistor coupled with an input line and configured to indicate a synaptic weight, a fuse coupled with the resistor, a selection component coupled with the fuse, the selection component configured to activate the fuse for programming the resistor, and a second selection component coupled with the resistor and an output line, the second selection component configured to select the resistor for a read operation.

DETAILED DESCRIPTION

The improved techniques, methods, and related devices and integrated circuits described herein may support an artificial neural network for deep learning, machine learning, etc. For example, the improved techniques, methods, and related devices and integrated circuits described herein for realizing an artificial neural network may be applicable across various platforms (e.g., mobile devices), which may be unachievable using conventional techniques. An integrated circuit and related device described herein may realize an improved artificial neural network by using a combination of circuit elements such as one or more precision resistors, eFuses, and programmable transistors. The integrated circuit and related device may offer a precise weight of each artificial neuron in the artificial neural network using the combination of precision resistors, which can be programmed by one or more eFuses.

Aspects of the disclosure are initially described in the context of a device supporting artificial neural networks with precision weight for artificial intelligence. Aspects of the disclosure are further illustrated by and described with reference to apparatus diagrams, system diagrams, and flowcharts that relate to artificial neural networks with precision weight for artificial intelligence.

Figure 1:
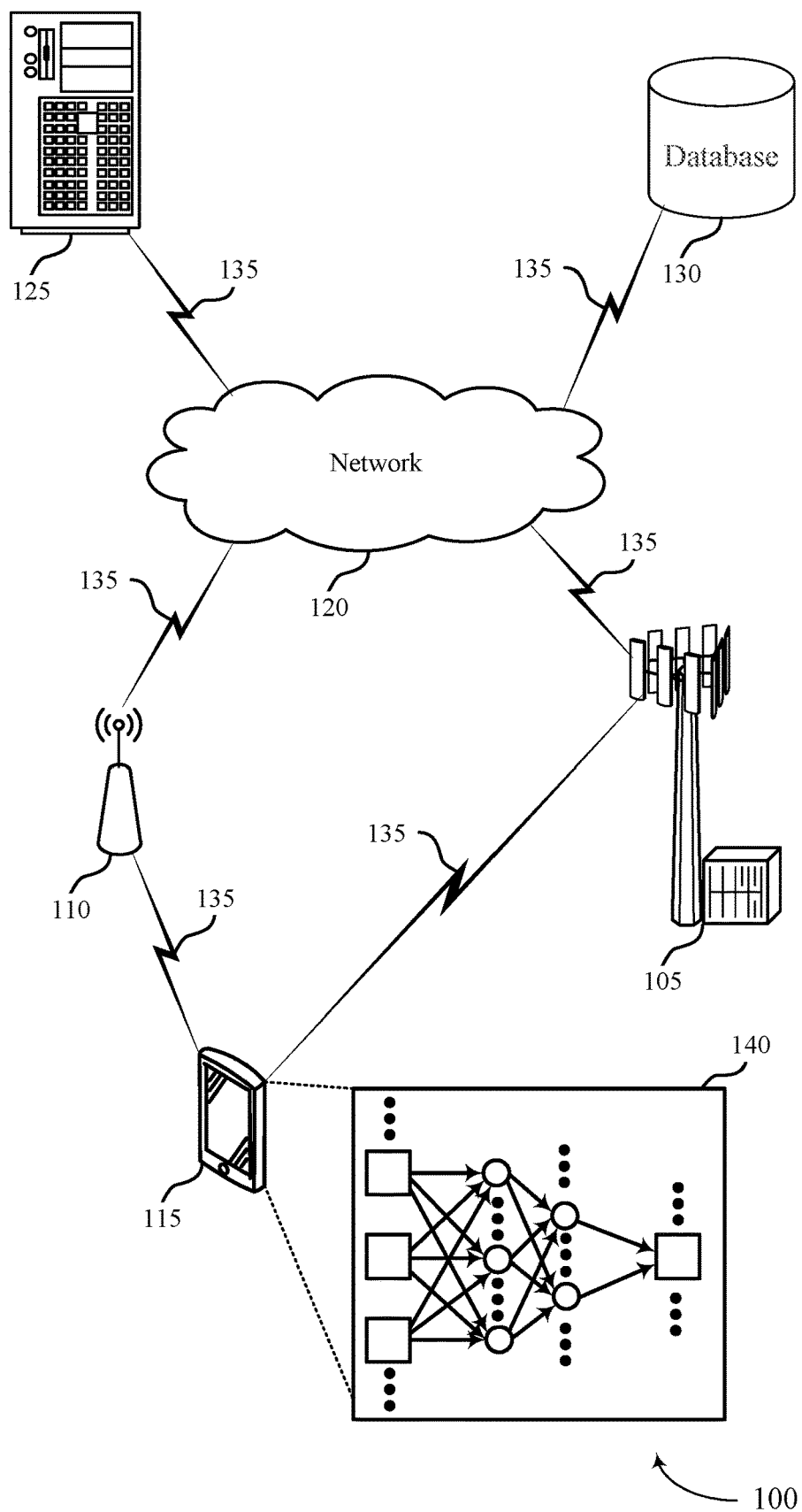
FIG. 1 illustrates an example of a system for an artificial neural network that supports artificial neural networks with precision weight for artificial intelligence in accordance with aspects of the present disclosure.

FIG. 1 illustrates an example of a system 100 that supports artificial neural networks with precision weight for artificial intelligence in accordance with aspects of the present disclosure. The system 100 may include a base station 105, an access point 110, a device 115, a server 125, and a database 130. The system 100 may support artificial neural networks for neuromorphic and non-von Neuman computation, among others.

In some examples, the device 115 may be stationary and/or mobile. In some examples, the device 115 may include a cellular phone, a smartphone, a digital camera, a standalone camera, a kiosk, a photo booth, a personal digital assistant (PDA), a wireless communication device, a handheld device, a tablet computer, a laptop computer, a cordless phone, a display device (e.g., monitors), and/or the like. The device 115 may, additionally or alternatively, include or be referred to by those skilled in the art as a user equipment (UE), a user device, a smartphone, a BLUETOOTH® device, a Wi-Fi® device, a mobile station, a subscriber station, a mobile unit, a subscriber unit, a wireless unit, a remote unit, a mobile device, a wireless device, a wireless communications device, a remote device, an access terminal, a mobile terminal, a wireless terminal, a remote terminal, a handset, a user agent, a mobile client, a client, and/or some other suitable terminology. In some cases, the device 115 may also be able to communicate directly with another device (e.g., using a peer-to-peer (P2P) or device-to-device (D2D) protocol).

The device 115 may support an artificial neural network 140, which may include a quantity of interconnected "artificial neurons" that can compute values from inputs. Device 115 may use the artificial neural network 140 to learn and recognize patterns by implementing neuromorphic and non-von Neuman computation. In some examples, the artificial neural network 140 may be used for image processing, voice and object recognition, machine learning, natural language processing, cloud-based applications, among others. In other examples, the artificial neural network 140 may be employed in convolution neural networks (CNN) or deep belief networks (DBN).

The artificial neural network 140 may be applicable across various platforms (e.g., mobile devices), which may be unachievable using various other techniques. In some implementations, the artificial neural network 140 may be an improved artificial neural network realized using a combination of circuit elements such as precision resistors, eFuses, and programmable transistors. As a result, the artificial neural network 140 may provide a precise weight for each artificial neuron in the artificial neural network 140 using the combination of precision resistors. The improved artificial neural network 140 may also reduce computation and memory usage (e.g., central processing unit (CPU), graphics processing unit (GPU), field-programmable gate array (FPGA), application-specific integrated circuit (ASIC)) and improve energy efficiency for the device 115 compared to conventional artificial neural networks.

The server 125 may include any combination of a data server, a cloud server, a server associated with an automation service provider, proxy server, mail server, web server, application server, database server, communications server, home server, mobile server, or any combination thereof. The server 125 may also transmit to the device 115 a variety of information, such as instructions or commands (e.g., training data, parameters) relevant to improving performance and training of the artificial neural network 140. The database 130 may store data that may include instructions or commands (e.g., training data, parameters) relevant to artificial neural network 140 of the device 115. The device 115 may retrieve the stored data from the database 130 via the base station 105 and/or the access point 110.

The network 120 that may provide encryption, access authorization, tracking, Internet Protocol (IP) connectivity, and other access, computation, modification, and/or functions. Examples of network 120 may include any combination of cloud networks, local area networks (LAN), wide area networks (WAN), virtual private networks (VPN), wireless networks (using 802.11, for example), cellular networks (using third generation (3G), fourth generation (4G), long-term evolution (LTE), or new radio (NR) systems (e.g., fifth generation (5G) for example), etc. Network 120 may include the Internet.

The base station 105 may wirelessly communicate with the device 115 via one or more base station antennas. Base station 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. The device 115 described herein may be able to communicate with various types of base stations and network equipment including macro eNBs, small cell eNBs, gNBs, relay base stations, and the like. The access point 110 may be configured to provide wireless communications for the device 115 over a relatively smaller area compared to the base station 105.

The wireless communication links 135 shown in the system 100 may include uplink (UL) transmissions from the device 115 to the base station 105, the access point 110, or the server 125, and/or downlink (DL) transmissions, from the base station 105, the access point 110, or the server 125 to the device 115. The downlink transmissions may also be called forward link transmissions while the uplink transmissions may also be called reverse link transmissions. The wireless communication links 135 may transmit bidirectional communications and/or unidirectional communications. Wireless communication links 135 may include one or more connections, including but not limited to, 345 MHz, Wi-Fi®, BLUETOOTH®, BLUETOOTH® Low Energy, cellular, Z-WAVE®, 802.11, peer-to-peer, LAN, wireless local area network (WLAN), Ethernet, FireWire®, fiber optic, and/or other connection types related to wireless communication systems.

Figure 2:
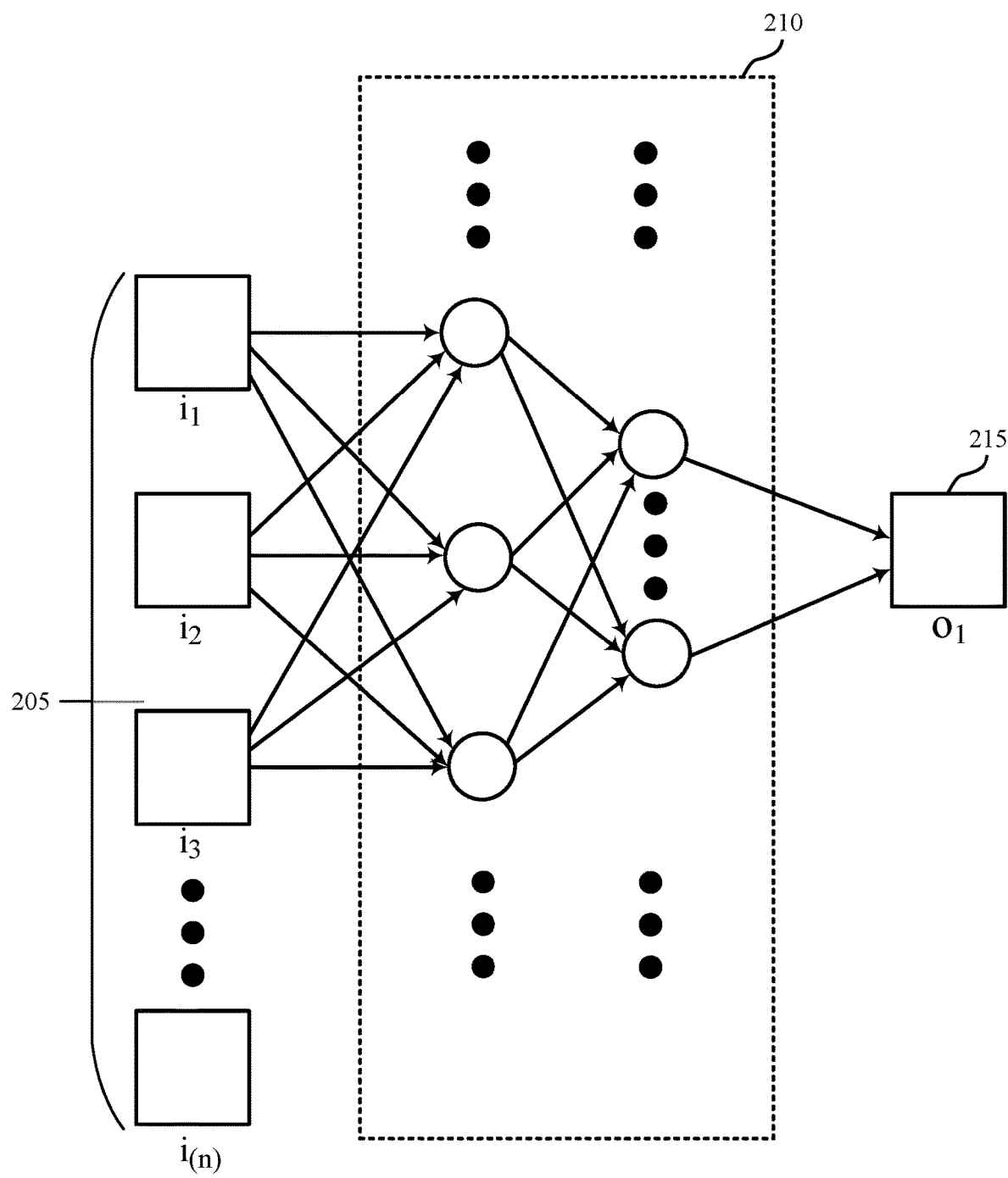
FIG. 2 illustrates an example diagram of an artificial neural network in accordance with aspects of the present disclosure.

FIG. 2 illustrates an example diagram of an artificial neural network 200 in accordance with aspects of the present disclosure. In some examples, the artificial neural network 200 may implement aspects of the system 100. For example, the artificial neural network 200 may be an example of or include components of the artificial neural network 140 as described with reference to FIG. 1. The artificial neural network 200 may include one or more inputs 205 communicatively connected to a layer 210 including one or more artificial neurons, which may be communicatively connected to one or more outputs 215. The layer 210 may include a quantity of layers each having one or more artificial neurons. Each artificial neuron may be connected with all artificial neurons belonging to another neighboring layer through synapses. Information flows from left to right, from each layer to the next adjacent layer. As such, the artificial neural network 200 may be configured as a set of connected layers. The strength of a connection between two artificial neurons across a synapse may be referred to as a "synaptic weight," which can be represented as a numerical value. Hence, the output of an artificial neuron may be computed by the addition of all the input artificial neurons from the previous layer pondered by their synaptic weight, an operation also referred to as a "dot-product".

In some cases, artificial neural networks have extensive computational requirements that may be prohibitive in traditional low-power devices due to their limited power budget and processing abilities. To overcome these issues, the artificial neural network 200 may be realized using a combination of circuit elements such as one or more precision resistors, eFuses, and programmable transistors, which may offer orders of magnitude improved energy efficiency compared to other artificial neural networks.

Figure 3:
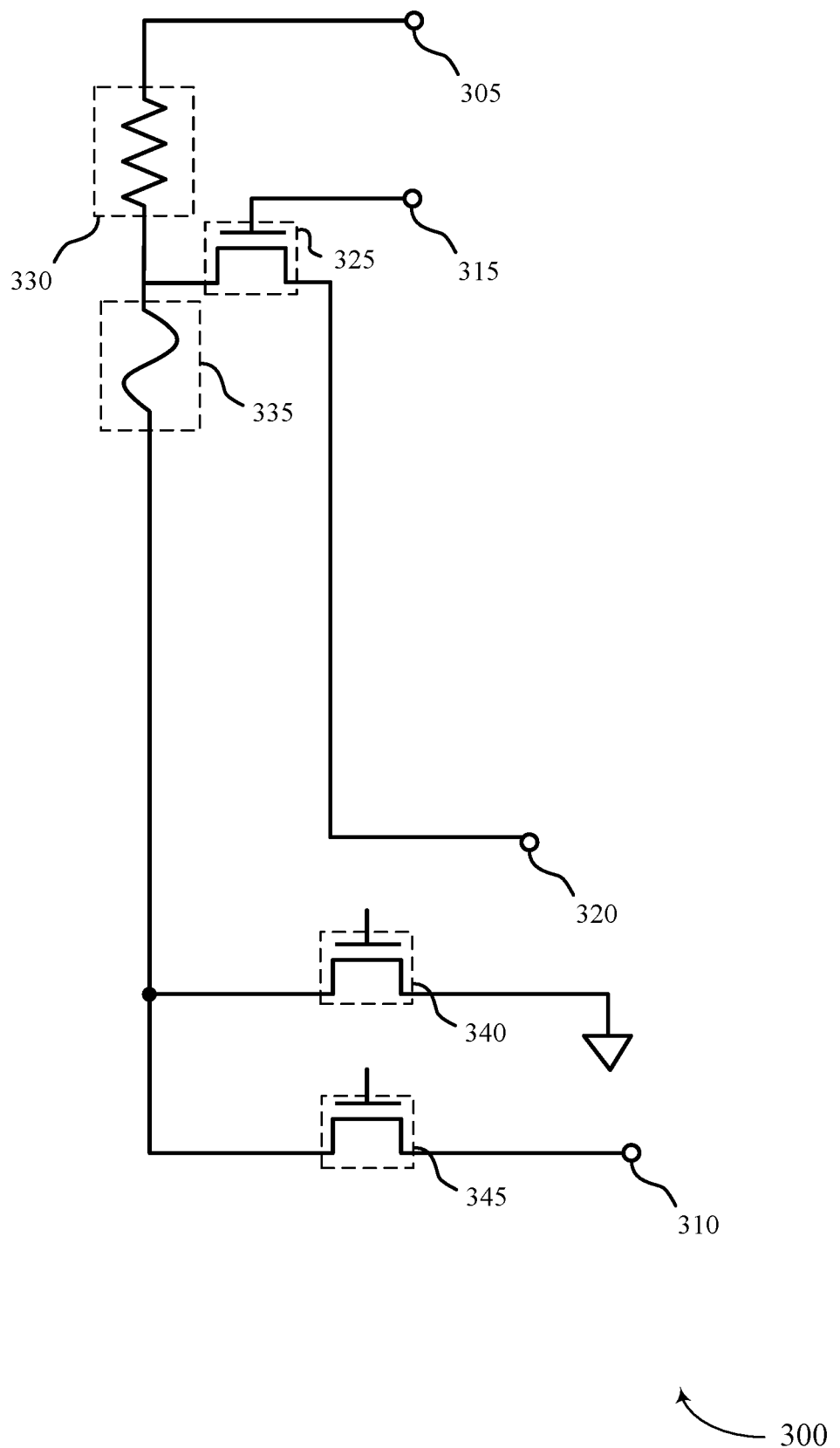
FIGS. 3 and 4 illustrate examples of circuits that supports artificial neural networks with precision weight for artificial intelligence in accordance with aspects of the present disclosure.

FIG. 3 illustrates an example of a circuit 300 that supports artificial neural networks with precision weight for artificial intelligence in accordance with aspects of the present disclosure. In some examples, the circuit 300 may implement aspects of the artificial neural networks as described with reference to FIGS. 1 and 2. For example, circuit 300 may be an example of or include components of the artificial neural network 140 as described with reference to FIG. 1. In some examples, the circuit 300 may represent a single artificial neuron of an artificial neural network. The circuit 300 may include an input line 305, an output line 310, a selection line 315, a voltage source line 320, a selection component 325, a selection component 340, a selection component 345, and an output line 310.

The selection component 325 may be coupled with the resistor 330, which may be a precision metal resistor, and may be selected by operating various elements represented in the circuit 300. For example, the circuit 300 may also include a voltage source (not shown), and the selection component 325 may be coupled with the voltage source. A precision metal resistor may be configured with a metal-film resistivity and axial leaded. The precision metal resistor may also be configured to provide higher tolerance (e.g., 0.05%), lower inductance, lower temperature coefficient resistance (TCR), among other advantages. In some examples, the voltage source may be direct-current (DC) source or an alternating current (AC) source. The selection component 325 may be in electronic communication with the resistor 330 when the voltage source applies an activation voltage to the selection component 325, and the selection component 325 can be isolated from the circuit 300 when the selection component 325 is deactivated. In some cases, the selection component 325 may be in electronic communication with the voltage source line 320, which may be coupled to the voltage source that may apply a voltage across an eFuse 335 for programming the eFuse 335. The eFuse 335 may allow for real-time programming and/or reprogramming of the artificial neuron (e.g., circuit 300). In some examples, the eFuse 335 may be a metal fuse.

In some examples, the selection component 340 may be coupled with the eFuse 335 and configured to activate the eFuse 335 for connecting or disconnecting the resistor 330. For example, the selection component 340 may be coupled with the voltage source (not shown). The selection component 340 may be in electronic communication with the eFuse 335 when the voltage source applies an activation voltage to the selection component 340, and the selection component 340 can be isolated from the circuit 300 when the selection component 340 is deactivated. The selection component 340 may also be virtually grounded. In some examples, the resistor 330 may be disconnected from the circuit 300 based at least in part on activating the eFuse 335. Thereby, affecting a synaptic weight of the artificial neuron represented by the circuit 300. In some cases, a resistance value of the resistor 330 may be updated based at least in part on a voltage drop across the resistor 330. The voltage drop may be based on a current from a first node of the resistor 330 (e.g., related to the input line 305) and a current at a second node of the resistor 330 (e.g., related to the eFuse 335 and/or the selection component 325). As a result, a synaptic weight represented by a resistance value of the resistor 330 may be adjustable (e.g., represent various values other than a binary 0 and 1). In some examples, the voltage drop induced across the resistor 330 may be based at least in part on activating the selection component 325 and/or the eFuse 335.

In other examples, the selection component 345 may be coupled with the resistor 330 and the output line 310, and may be selected by operating various elements represented in the circuit 300 to select the resistor 330 for a read operation. For example, the selection component 345 may be coupled with the voltage source (not shown). The selection component 345 may be in electronic communication with the resistor 330 when the voltage source applies an activation voltage to the selection component 345, and the selection component 345 can be isolated from the circuit 300 when the selection component 345 is deactivated. The synaptic weight of the artificial neuron represented by the circuit 300 may be determined based on or by reading a value (e.g., resistance value) of the resistor 330 based on coupling the resistor 330 and the input line 305 with the output line 310 by having the voltage source apply an activation voltage to the selection component 345. By having the synaptic weight represented by a resistance value of a resistor that may be adjustable may result in the improved artificial neural network represented by the circuit 300.

Activating the selection component 325, the selection component 340, and/or the selection component 345 may be referred to as selecting the resistor 330 in some examples, and deactivating the selection component 325, the selection component 340, and/or the selection component 345 may be referred to as deselecting the resistor 330 in some examples. In some examples, the selection component 325, the selection component 340, and/or the selection component 345 may be a transistor and its operation may be controlled by applying an activation voltage to the transistor gate, where the voltage for activating the transistor (e.g., the voltage between the transistor gate terminal and the transistor source terminal) is greater than the threshold voltage magnitude of the transistor.

The circuit 300 may provide an improved artificial neural network by realizing an artificial neuron of the artificial neural network realized a combination of circuit elements such as one or more precision resistors, eFuses, and programmable transistors. As a result, the artificial neural network may provide a precise weight for each artificial neuron in the artificial neural network using the combination of precision resistors, which can be programmed by the eFuse. The improved artificial neural network may reduce computation and memory usage, and improve energy consumption of the circuit 300 compared to conventional artificial neural networks.

Figure 4:
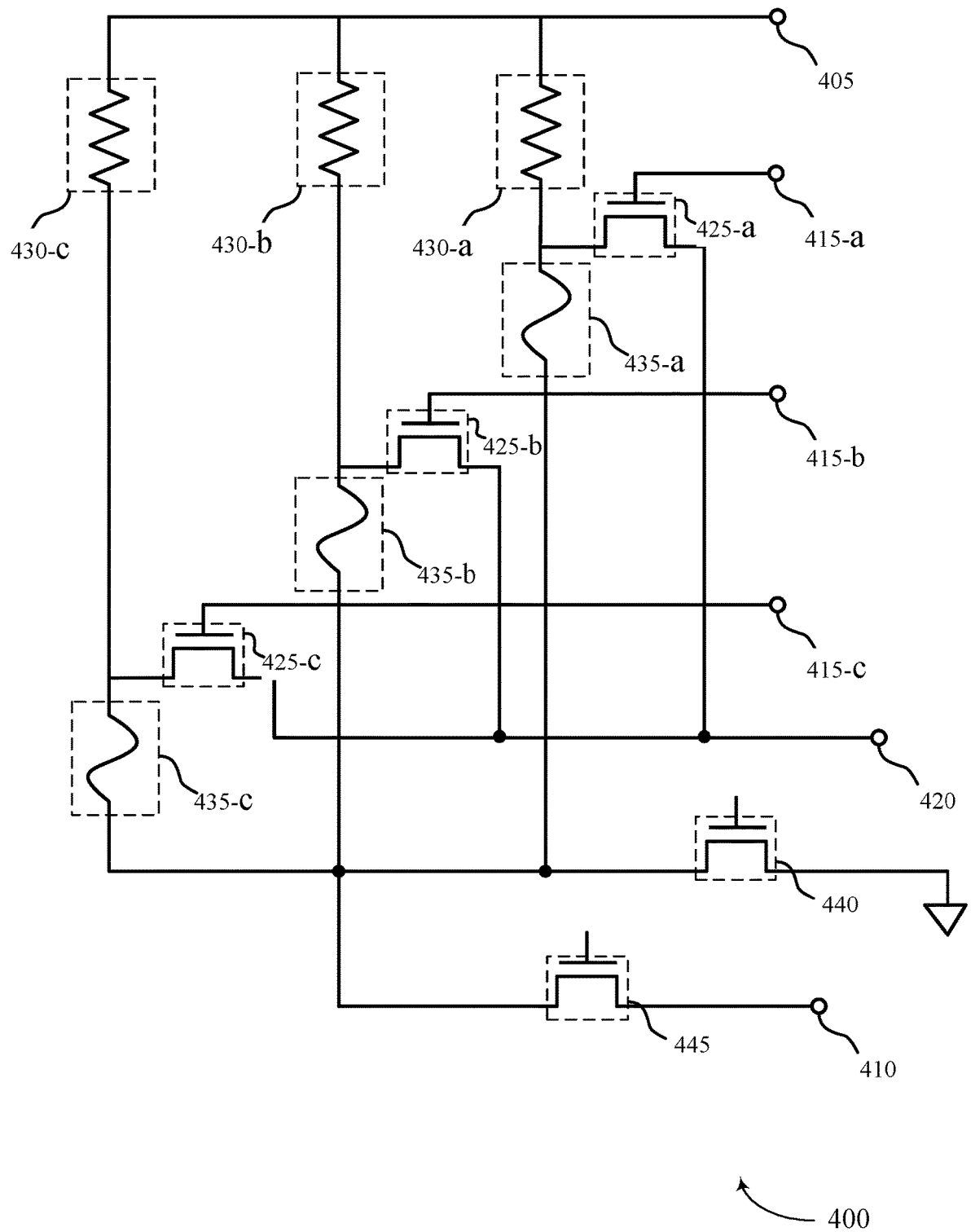

FIG. 4 illustrates an example of a circuit 400 that supports artificial neural networks with precision weight for artificial intelligence in accordance with aspects of the present disclosure. In some examples, the circuit 400 may implement aspects of the circuit 300 as described with reference to FIG. 3. In some examples, the circuit 400 may implement aspects of the artificial neural networks as described with reference to FIGS. 1 through 3. For example, circuit 400 may be an example of or include components of the artificial neural network 140 as described with reference to FIG. 1. In some examples, the circuit 400 may represent a single artificial neuron of an artificial neural network.

The circuit 400 may include an input line 405, an output line 410, a plurality of selection lines 415 (e.g., selection line 415-a, selection line 415-b, and selection line 415-c), a voltage source line 420, a plurality of selection components 425 (e.g., selection component 425-a, selection component 425-b, and selection component 425-c), a plurality of resistors 430 (e.g., resistor 430-a, resistor 430-b, and resistor 430-c), a plurality of eFuses 435 (e.g., eFuse 435-a, eFuse 435-b, and eFuse 435-c), a selection component 440, a selection component 445, and an output line 410.

Each selection component 425 of the plurality may be coupled with a corresponding resistor 430, which may be a precision metal resistor, and may be selected by operating various elements represented in the circuit 400. For example, the circuit 400 may also include a voltage source (not shown), and each selection component 425 may be coupled with the voltage source. Each selection component 425 may be in electronic communication with a corresponding resistor 430 based on the voltage source applying an activation voltage to the corresponding selection component 425, and the corresponding selection component 325 can be isolated from the circuit 400 when it is deactivated. In some cases, each selection component 425 may be in electronic communication with the voltage source line 420, which may be coupled to the voltage source that may apply a voltage across a corresponding eFuse 435 for programming the eFuse 435.

In some examples, the selection component 340 may be coupled with each corresponding eFuse 435 and configured to activate at least one of the plurality of eFuse 435 for programming a corresponding resistor 430. For example, the selection component 440 may be coupled with the voltage source (not shown). The selection component 440 may be in electronic communication with each of the eFuses 435 when the voltage source applies an activation voltage to the selection component 440, and the selection component 440 can be isolated from the circuit 400 when the selection component 440 is deactivated. The selection component 440 may also be virtually grounded. In some examples, the resistor 430 may be disconnected from the circuit 400 based at least in part on activating a corresponding eFuse 435. Thereby, affecting a synaptic weight of the artificial neuron represented by the circuit 400. For example, disconnecting any of the resistors 430 may affect the synaptic weight of the artificial neuron because the synaptic weight is a combination of the resistance values of the combined resistors 430 connected in the circuit 400. In some examples, the synaptic weight may be represented by one or more bits. For example, at least a combination of two resistors 430 may provide 4-bits per weight.

In some cases, a resistance value of the resistors 430 may be updated based at least in part on a voltage drop across the resistor 430. The voltage drop may be based on a current from a first node of the resistor 430 (e.g., related to the input line 405) and a current at a second node of the resistor 430 (e.g., related to a corresponding eFuse 435 and/or a corresponding selection component 425). As a result, a synaptic weight represented by a resistance value of the resistor 430 may be adjustable (e.g., represent various values other than a binary 0 and 1). In some examples, the voltage drop induced across the resistor 430 may be based at least in part on activating the selection component 425 and/or the eFuse 435. By having the synaptic weight represented by a resistance value of a resistor that may be adjustable may result in the improved artificial neural network represented by the circuit 400.

In other examples, the selection component 445 may be coupled with each resistor 430 and the output line 410, and may be selected by operating various elements represented in the circuit 400 to select the resistors 430 for a read operation. For example, the selection component 445 may be coupled with the voltage source (not shown). The selection component 445 may be in electronic communication with each resistor 430 when the voltage source applies an activation voltage to the selection component 445, and the selection component 445 can be isolated from the circuit 400 when the selection component 445 is deactivated. The synaptic weight of the artificial neuron represented by the circuit 400 may be determined by reading a value (e.g., resistance value) of each of the resistors 430 based on coupling the resistors 430 and the input line 405 with the output line 410 by having the voltage source apply an activation voltage to the selection component 445.

The circuit 400 provide an improved artificial neural network by realizing an artificial neuron of the artificial neural network realized a combination of circuit elements such as precision resistors, an eFuse, and programmable transistors. As a result, the artificial neural network may provide a precise weight for each artificial neuron in the artificial neural network using the combination of precision resistors, which can be programmed by the eFuse.

Figure 5:
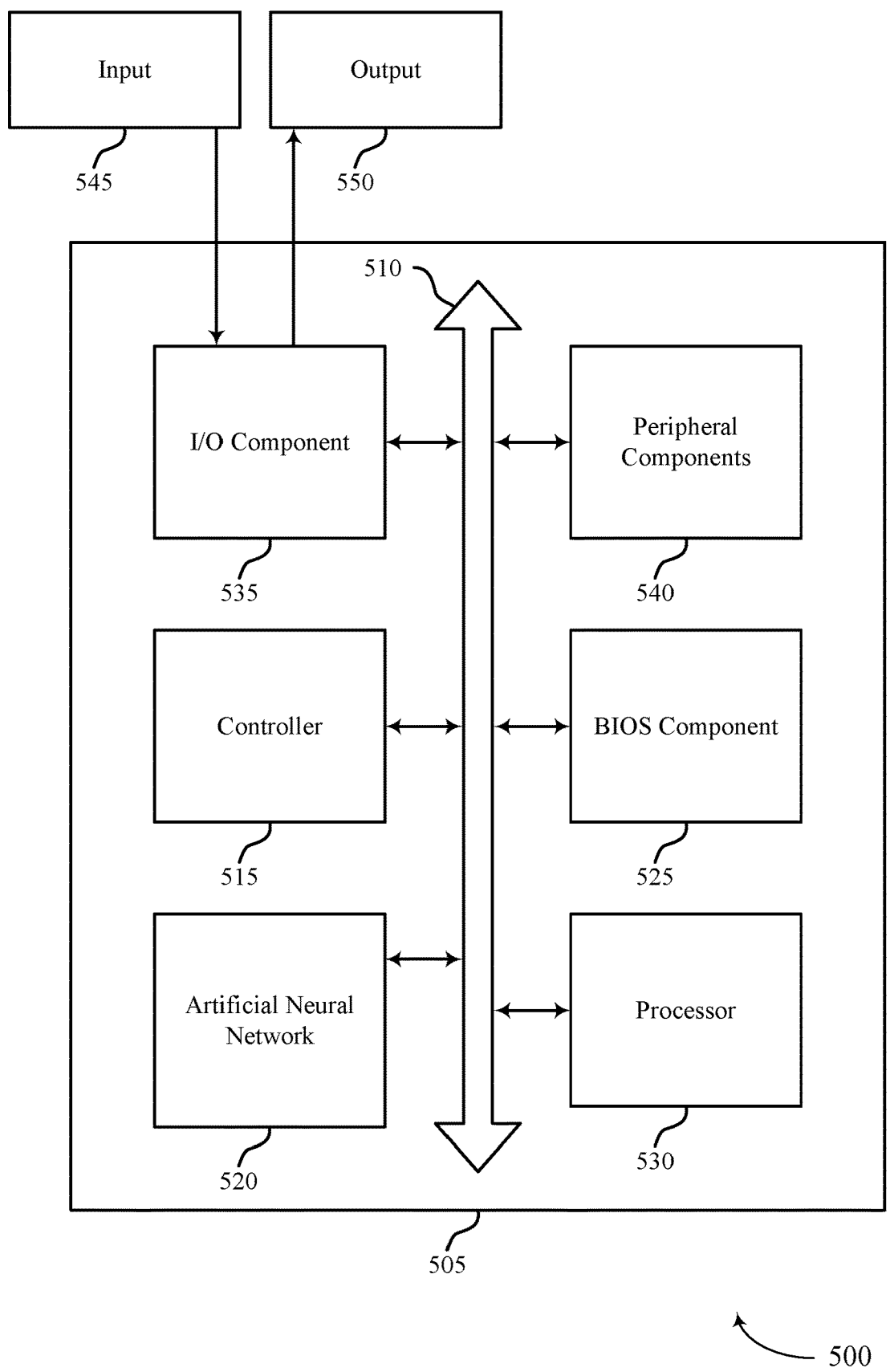
FIG. 5 illustrates an example of a block diagram of a system including a device that supports artificial neural networks with precision weight for artificial intelligence in accordance with aspects of the present disclosure.

FIG. 5 shows a block diagram of a system 500 including a device 505 that supports artificial neural networks with precision weight for artificial intelligence in accordance with aspects of the present disclosure. The device 505 may include one or more artificial neurons in an artificial neural network that may be used for processors, memory, or computing applications, and the like. The device 505 may be an example of or include components of an artificial neural network as described above, for example, with reference to FIGS. 1 through 4. The device 505 may include components for bi-directional communications including components for transmitting and receiving communications, including a controller 515, an artificial neural network 520, a basic input/output system (BIOS) component 525, a processor 530, an I/O component 535, and peripheral components 540. These components may be in electronic communication via one or more busses (e.g., bus 510).

The controller 515 may operate one or more artificial neurons in the artificial neural network 520. In some examples, the one or more artificial neurons in the artificial neural network 520 may be used for neuromorphic computing. Specifically, the controller 515 may be configured to support accessing one or more artificial neurons in the artificial neural network 520 (e.g., reading or programming an artificial neuron). In some cases, the controller 515 may include a row decoder, column decoder, or both for accessing the artificial neuron via an input line. The one or more artificial neurons may store information (e.g., in the form of a logic state, a synaptic weight (e.g., indicated by a resistance value)) as described herein.

In some examples, each of the one or more artificial neurons in the artificial neural network 520 may be coupled to a corresponding memory cell (not shown). In some examples, the memory cells may define a random access memory (RAM) or read only memory (ROM). The memory cells may, additionally or alternatively, define a dynamic RAM (DRAM), synchronous dynamic RAM (SDRAM), ferroelectric RAM (FeRAM), magnetic RAM (MRAM), resistive RAM (RRAM), flash memory, phase change memory (PCM), or any other medium that can be used to store desired program code in the form of instructions or data structures and that can be accessed by a computer or a processor. The memory cells may store computer-readable, computer-executable software including instructions that, when executed, cause the processor to perform various functions described herein.

The BIOS component 525 be a software component that includes BIOS operated as firmware, which may initialize and run various hardware components. The BIOS component 525 may also manage data flow between a processor and various other components, such as peripheral components, I/O control components, and others. The BIOS component 525 may include a program or software stored in read only memory (ROM), flash memory, or any other non-volatile memory.

The processor 530 may include an intelligent hardware device, (e.g., a general-purpose processor, a digital signal processor (DSP), an image signal processor (ISP), a central processing unit (CPU), a graphics processing unit (GPU), a microcontroller, an application-specific integrated circuit (ASIC), a field-programmable gate array (FPGA), a programmable logic device, a discrete gate or transistor logic component, a discrete hardware component, or any combination thereof). In other cases, a memory controller may be integrated into processor 530. Processor 530 may be configured to execute computer-readable instructions stored in a memory to perform various functions (e.g., functions or tasks supporting dual phase detection auto focus power optimization).

The I/O component 535 may manage input and output signals for the device 505. The I/O component 535 may also manage peripherals not integrated into the device 505. In some cases, the I/O component 535 may represent a physical connection or port to an external peripheral. In some cases, the I/O component 535 may utilize an operating system such as iOS®, ANDROID®, MS-DOS®, MS-WINDOWS®, OS/2®, UNIX®, LINUX®, or another known operating system. In other cases, the I/O component 535 may represent or interact with a modem, a keyboard, a mouse, a touch-screen, or a similar device. In some cases, the I/O component 535 may be implemented as part of a processor. In some cases, a user may interact with the device 505 via the I/O component 535 or via hardware components controlled by the I/O component 535. The I/O component 535 may support accessing the one or more artificial neurons in the artificial neural network 520, including receiving information associated with the sensed logic state of the one or more artificial neurons in the artificial neural network 520, or providing information associated with writing a logic state of one or more artificial neurons in the artificial neural network 520.

The peripheral components 540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 545 may represent a device or signal external to the device 505 that provides input to the device 505 or its components. This may include a user interface or an interface with or between other devices. In some cases, the input 545 may be managed by the I/O component 535, and may interact with the device 505 via a peripheral component 540.

The output 550 may represent a device or signal external to the device 505 configured to receive output from the device 505 or any of its components. Examples of the output 550 may include a display, audio speakers, a printing device, another processor or printed circuit board, or other devices. In some cases, the output 550 may be a peripheral element that interfaces with the device 505 via the peripheral component(s) 540. In some cases, the output 550 may be managed by the I/O component 535.

As detailed above, the system 500 and/or one or more components of the system 500 may perform and/or be a means for performing, either alone or in combination with other elements, one or more operations for supporting artificial neural networks with precision weight for artificial intelligence.

Figure 6:
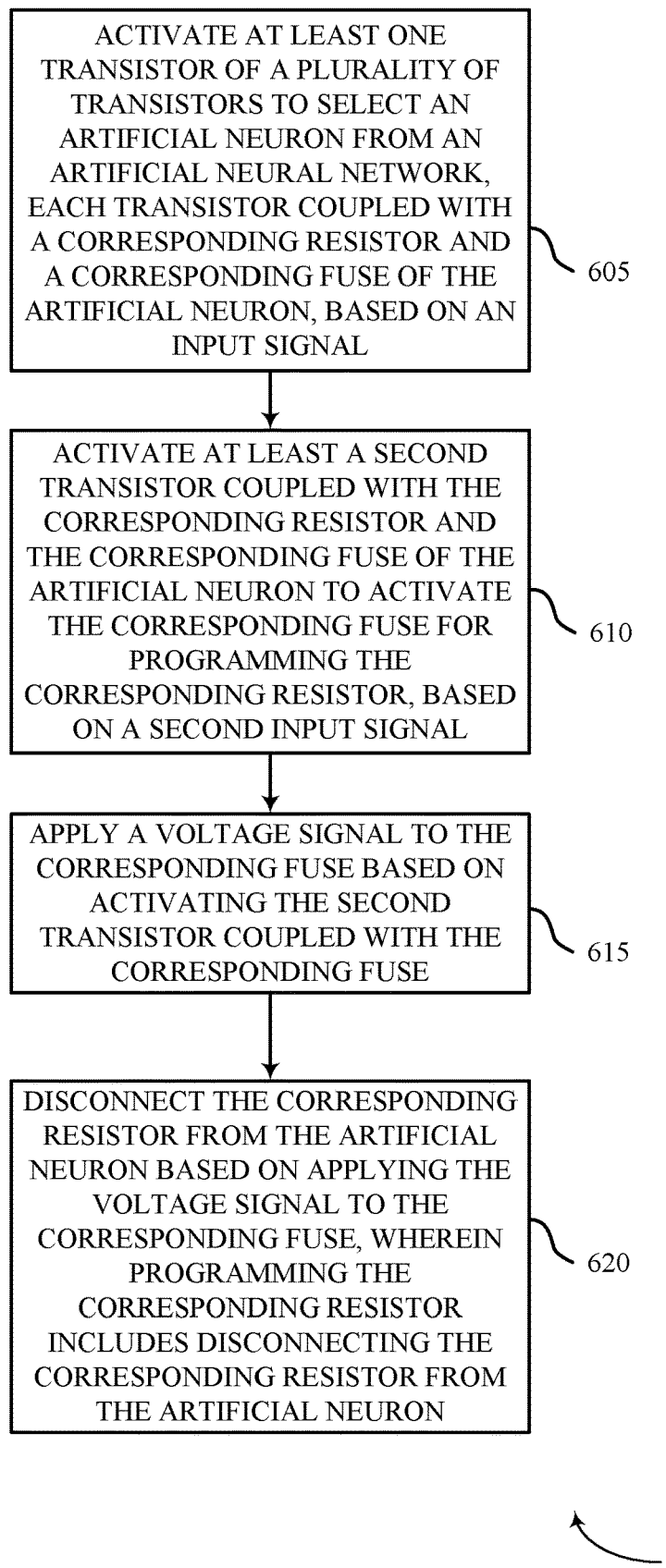
FIGS. 6 and 7 illustrate examples of methods that support artificial neural networks with precision weight for artificial intelligence in accordance with aspects of the present disclosure.

FIG. 6 shows a flowchart illustrating a method 600 that supports artificial neural networks with precision weight for artificial intelligence in accordance with aspects of the present disclosure. In some examples, the operations of method 600 may include a programming operation on an artificial neuron of an artificial neural network. The operations of method 600 may be implemented by a device or integrated circuit, or their components as described herein. For example, operations of method 600 may be performed at least in part by controller 515 as described with reference to FIG. 5. In some examples, the controller 515 may execute a set of instructions to control the functional elements of the controller 515 to perform the functions described below. Additionally, or alternatively, the controller 515 may perform some or all the functions described below using special-purpose hardware.

In the following description of the method 600, the operations may be performed in a different order than the exemplary order shown, or at different times. Certain operations may also be left out of the method 600, or other operations may be added to the method 600.

At 605 the controller 515 may activate at least one transistor of a plurality of transistors to select an artificial neuron from an artificial neural network, each transistor coupled with a corresponding resistor and a corresponding fuse of the artificial neuron, based on an input signal. In some examples, the artificial neural network may be an example of or include the components of the artificial neural network 520 as described, for example, with reference to FIG. 5. The input signal may be a voltage signal generated by the controller 515. Alternatively, the voltage signal may be generated by a voltage source coupled with the controller 515. The operations of 605 may be performed according to the methods described herein.

At 610 the controller 515 may activate at least a second transistor coupled with the corresponding resistor and the corresponding fuse of the artificial neuron to activate the corresponding fuse for programming the corresponding resistor, based on a second input signal. In some examples, the second input signal may be a voltage signal generated by the controller 515. Alternatively, the voltage signal may be generated by a voltage source coupled with the controller 515. The operations of 610 may be performed according to the methods described herein.

At 615 the controller 515 may apply a voltage signal to the corresponding fuse based on activating the second transistor coupled with the corresponding fuse. The voltage signal may be generated by a voltage source coupled with the controller 515. The operations of 615 may be performed according to the methods described herein.

At 620 the controller 515 may disconnect the corresponding resistor from the artificial neuron based on applying the voltage signal to the corresponding fuse, where programming the corresponding resistor includes disconnecting the corresponding resistor from the artificial neuron. The operations of 620 may be performed according to the methods described herein.

Figure 7:
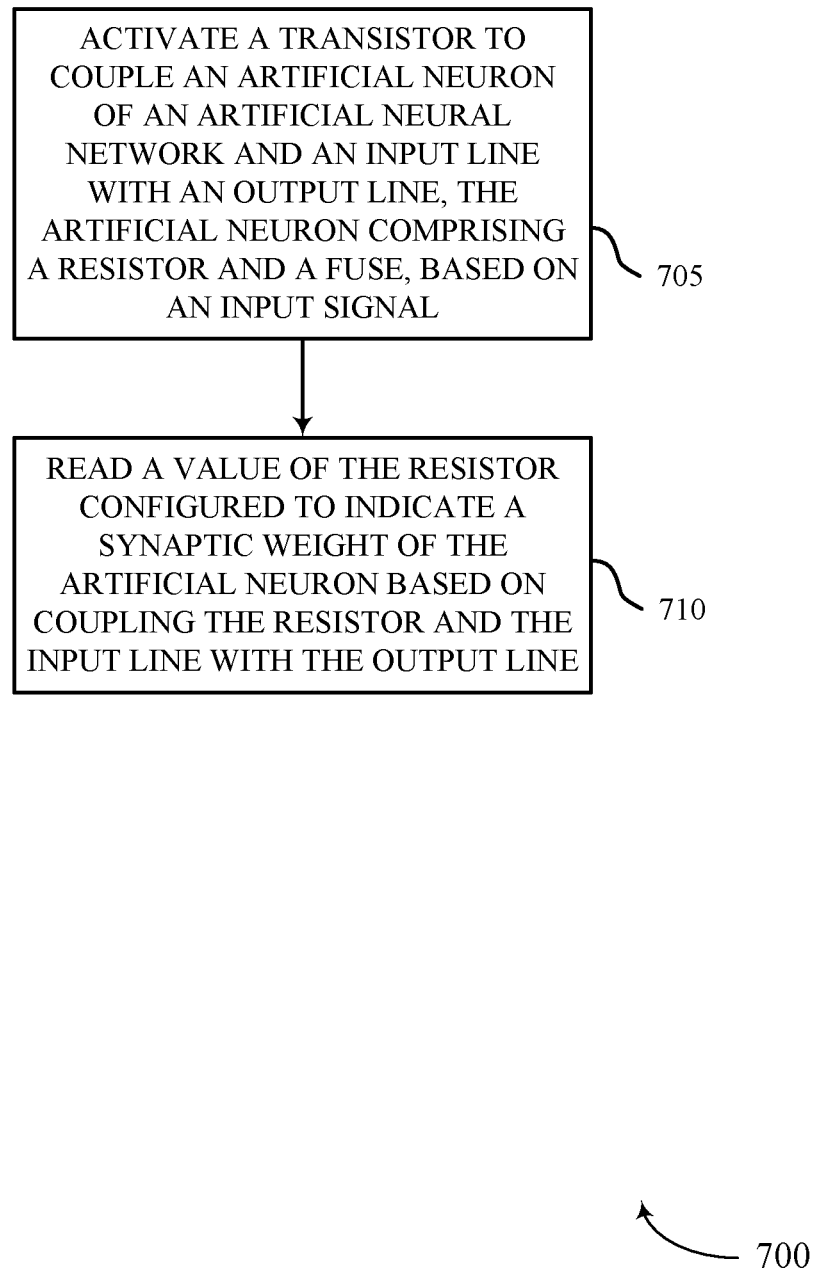

FIG. 7 shows a flowchart illustrating a method 700 that supports artificial neural networks with precision weight for artificial intelligence in accordance with aspects of the present disclosure. In some examples, the operations of method 700 may include a read operation on an artificial neuron of an artificial neural network. The operations of method 700 may be implemented by a device or integrated circuit, or their components as described herein. For example, operations of method 700 may be performed at least in part by controller 515 as described with reference to FIG. 5. In some examples, the controller 515 may execute a set of instructions to control the functional elements of the controller 515 to perform the functions described below. Additionally, or alternatively, the controller 515 may perform some or all the functions described below using special-purpose hardware.

In the following description of the method 700, the operations may be performed in a different order than the exemplary order shown, or at different times. Certain operations may also be left out of the method 700, or other operations may be added to the method 700.

At 705 the controller 515 may activate a transistor to couple an artificial neuron of an artificial neural network and an input line with an output line, the artificial neuron including a resistor and a fuse, based on an input signal. In some examples, the artificial neural network may be an example of or include the components of the artificial neural network 520 as described, for example, with reference to FIG. 5. The operations of 705 may be performed according to the methods described herein.

At 710 the controller 515 may read a value of the resistor configured to indicate a synaptic weight of the artificial neuron based on coupling the resistor and the input line with the output line. The operations of 710 may be performed according to the methods described herein.

It should be noted that the methods described above describe possible implementations, and that the operations and the steps may be rearranged or otherwise modified and that other implementations are possible. Further, aspects from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized.

By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device for an artificial neural network, comprising:
   an input line;
   an output line; and
   an artificial neuron comprising:
      a resistor having a first terminal coupled with the input line to indicate a synaptic weight;
      a fuse coupled with the resistor at a second terminal of the resistor;
      a first selection component having a first terminal and a second terminal, the second terminal of the first selection component coupled to a voltage source, and the first terminal of the first selection component coupled with the fuse and the resistor at the second terminal of the resistor to activate the fuse for programming the resistor to adjust the synaptic weight based at least in part on varying a resistance of the resistor, the fuse operable to connect and disconnect the resistor from the artificial neuron based at least in part on whether the first selection component activates the fuse; and
      a second selection component coupled with the resistor and the output line to select the resistor for a read operation to determine the adjusted synaptic weight.

2. The device of claim 1, further comprising:
   the voltage source coupled with the artificial neuron via the first selection component, and configured to activate the fuse for programming the resistor, or select the resistor for the read operation, or both.

3. The device of claim 2, wherein the voltage source is further configured to:
   apply a voltage signal to the first selection component to activate the fuse for programming the resistor.

4. The device of claim 2, wherein the first selection component coupled with the fuse is virtually grounded.

5. The device of claim 2, wherein the voltage source is further configured to:
   apply a voltage signal to the second selection component to couple the resistor and the input line with the output line.

6. The device of claim 5, further comprising:
   a controller coupled with the artificial neuron to read a value of the resistor configured to indicate the synaptic weight of the artificial neuron based at least in part on coupling the resistor and the input line with the output line.

7. The device of claim 2, wherein the voltage source is coupled with a third selection component that is coupled with the fuse and the resistor, wherein selecting the resistor for the read operation is further based at least in part on coupling the third selection component with the fuse and the resistor.

8. The device of claim 2, wherein the artificial neuron further comprises:
   a second resistor coupled with the input line to indicate the synaptic weight;
   a second fuse coupled with the second resistor;
   a fourth selection component coupled with the second fuse to activate the second fuse for programming the second resistor; and
   a fifth selection component coupled with the second resistor and the output line to select the second resistor for the read operation.

9. The device of claim 8, wherein the voltage source is further configured to:
   apply a voltage signal to the fourth selection component to decouple the second fuse from the second resistor based at least in part on a programming operation.

10. The device of claim 9, further comprising:
    a controller coupled with the artificial neuron to disconnect the second resistor from the artificial neuron based at least in part on decoupling the second fuse from the second resistor.

11. The device of claim 8, wherein the adjusted synaptic weight of the artificial neuron is based at least in part on the resistance of the resistor and a resistance of the second resistor.

12. The device of claim 1, wherein the resistor comprises a precision metal resistor.

13. An artificial neuron of an artificial neural network, comprising:
    a resistor having a first terminal coupled with an input line to indicate a synaptic weight;
    a fuse coupled with the resistor at a second terminal of the resistor;
    a first selection component having a first terminal and a second terminal, the second terminal coupled to a voltage source, and the first terminal coupled with the fuse and the resistor at the second terminal of the resistor to activate the fuse for programming the resistor to adjust the synaptic weight based at least in part on varying a resistance of the resistor, the fuse operable to connect and disconnect the resistor from the artificial neuron based at least in part on whether the first selection component activates the fuse; and
    a second selection component coupled with the resistor and the output line to select the resistor for a read operation to determine the adjusted synaptic weight.

* * * * *